(12) United States Patent
Lu-Chen Hsu et al.

(10) Patent No.: US 8,610,244 B2
(45) Date of Patent: *Dec. 17, 2013

(54) LAYERED STRUCTURE WITH FUSE

(75) Inventors: Louis Lu-Chen Hsu, Fishkill, NY (US); Jack Allan Mandelman, Flat Rock, NC (US); William Robert Tonti, Essex Junction, VT (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/494,327

(22) Filed: Jun. 12, 2012

(65) Prior Publication Data

US 2012/0248567 A1 Oct. 4, 2012

Related U.S. Application Data

(60) Continuation of application No. 12/870,921, filed on Aug. 30, 2010, now Pat. No. 8,232,620, which is a division of application No. 11/680,131, filed on Feb. 28, 2007, now Pat. No. 7,785,934.

(51) Int. Cl.
*H01L 23/52* (2006.01)

(52) U.S. Cl.
USPC ................................. 257/529; 257/E23.149

(58) Field of Classification Search
USPC ............................................ 257/529, E23.149
See application file for complete search history.

(56) References Cited

U.S. PATENT DOCUMENTS

| | | | |
|---|---|---|---|
| 5,969,422 A | 10/1999 | Ting et al. | |
| 6,242,789 B1 | 6/2001 | Weber et al. | |
| 6,252,292 B1 | 6/2001 | Brintzinger et al. | |
| 6,307,213 B1 | 10/2001 | Huang et al. | |
| 6,498,385 B1 | 12/2002 | Daubenspeck et al. | |
| 6,611,039 B2 | 8/2003 | Anthony | |
| 6,730,982 B2 | 5/2004 | Barth et al. | |
| 6,989,604 B1 * | 1/2006 | Woo et al. | 257/774 |
| 7,074,698 B2 * | 7/2006 | Morita et al. | 438/513 |
| 7,785,934 B2 | 8/2010 | Hsu et al. | |
| 2004/0259035 A1 | 12/2004 | Greco | |
| 2005/0285222 A1 | 12/2005 | Thei et al. | |
| 2008/0206978 A1 | 8/2008 | Hsu et al. | |
| 2010/0320563 A1 | 12/2010 | Hsu et al. | |

OTHER PUBLICATIONS

Office Action (Mail Date Oct. 14, 2009) for U.S. Appl. No. 11/680,131, filed Feb. 28, 2007; Confirmation No. 4689.

(Continued)

*Primary Examiner* — Matthew Reames
(74) *Attorney, Agent, or Firm* — Schmeiser, Olsen & Watts, LLP; Richard M. Kotulak

(57) ABSTRACT

A structure. The structure includes: a substrate, a first electrode in the substrate, first dielectric layer above both the substrate and the first electrode, a second dielectric layer above the first dielectric layer, and a fuse element buried in the first dielectric layer. The first electrode includes a first electrically conductive material. A top surface of the first dielectric layer is further from a top surface of the first electrode than is any other surface of the first dielectric layer. The first dielectric layer includes a first dielectric material and a second dielectric material. A bottom surface of the second dielectric layer is in direct physical contact with the top surface of the first dielectric layer. The second dielectric layer includes the second dielectric material.

16 Claims, 18 Drawing Sheets

(56) References Cited

OTHER PUBLICATIONS

Amendment filed Dec. 17, 2009 in response to Office Action (Mail Date Oct. 14, 2009) for U.S. Appl. No. 11/680,131, filed Feb. 28, 2007; Confirmation No. 4689.
Notice of Allowance (Mail Date Apr. 16, 2010) for U.S. Appl. No. 11/680,131, filed Feb. 28, 2007; Confirmation No. 4689.
Office Action (Mail Date Nov. 3, 2011) for U.S. Appl. No. 12/870,921, filed Aug. 30, 2010; Confirmation No. 1819.
Amendment filed Jan. 30, 2012 in response to Office Action (Mail Date Nov. 3, 2011) for U.S. Appl. No. 12/870,921, filed Aug. 30, 2010; Confirmation No. 1819.
Notice of Allowance (Mail Date Mar. 23, 2012) for U.S. Appl. No. 12/870,921, filed Aug. 30, 2010; Confirmation No. 1819.

* cited by examiner

LAYERED STRUCTURE WITH FUSE

This application is a continuation application claiming priority to Ser. No. 12/870,921, filed Aug. 30, 2010, now U.S. Pat. No. 8,232,620, issued Jul. 31, 2012, which is a divisional of Ser. No. 11/680,131, filed Feb. 28, 2007, U.S. Pat. No. 7,785,934, issued Aug. 31, 2010.

FIELD OF THE INVENTION

The present invention relates generally to electronic fuses (efuses) and more particularly to diffusion barrier layers serving as efuses.

BACKGROUND OF THE INVENTION

In a conventional semiconductor integrated circuit (chip), there are efuses that can be programmed so as to determine the mode of operation of the chip. Therefore, there is a need for an efuse structure (and a method for forming the same) that is better than the efuses of the prior art.

SUMMARY OF THE INVENTION

The present invention provides an electrical fuse fabrication method, comprising forming a first electrode in a substrate; forming a dielectric layer on top of said first electrode; forming an opening in said dielectric layer such that said first electrode is exposed to a surrounding ambient through said opening; forming a fuse element on side walls and bottom walls of said opening such that said first electrode and said fuse element are electrically coupled together; and filling said opening with a dielectric material.

The present invention provides an efuse structure that is better than the efuses of the prior art.

DETAILED DESCRIPTION OF THE INVENTION

Figure 1A:
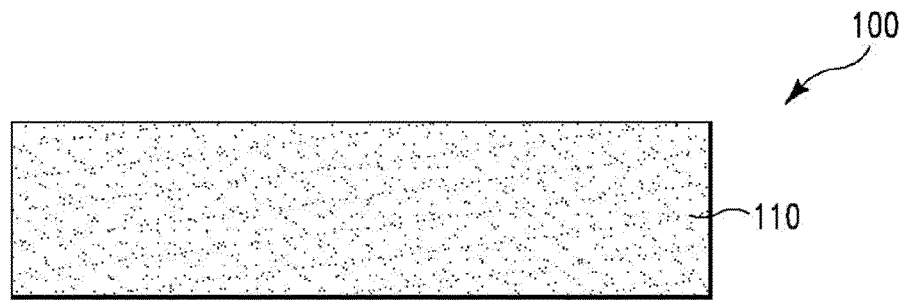
FIGS. 1A-1M show cross-section views used to illustrate a fabrication process for forming a semiconductor structure, in accordance with embodiments of the present invention.

FIGS. 1A-1M show cross-section views used to illustrate a fabrication process for forming a semiconductor structure 100, in accordance with embodiments of the present invention. More specifically, with reference to FIG. 1A, the fabrication process for forming the semiconductor structure 100 starts with a dielectric layer 110 on top of a front-end-of-line layer (not shown). The front-end-of-line (FEOL) layer contains semiconductor devices such as transistors, resistors, capacitors, etc. (not shown). The dielectric layer 110 comprises a dielectric material such as SiCOH or SiLK on top of the FEOL layer. The dielectric layer 110 can be referred to as an inter-level dielectric layer 110 of a back-end-of-line layer (not shown). Both the dielectric layer 110 and the front-end-of-line layer can comprise oxide, diamond, glass, ceramic, quartz, or polymer.

Figure 1B:
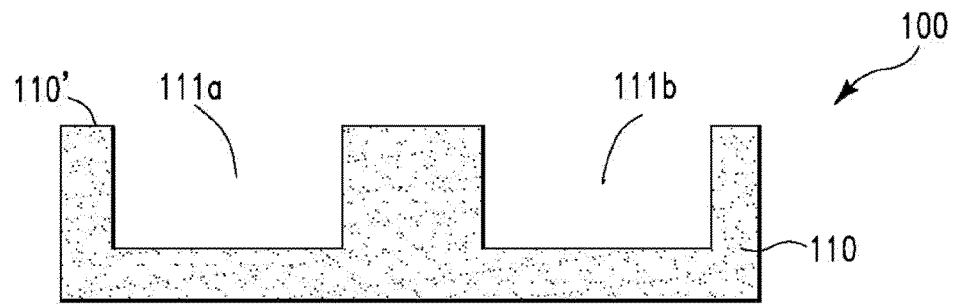

Next, with reference to FIG. 1B, in one embodiment, trenches 111a and 111b are formed in the dielectric layer 110. The trenches 111a and 111b can be formed by lithographic and etching processes. The trench 111a is later used for forming a M1 metal line (not shown), whereas the trench 111b is later used for forming a first electrode of an efuse structure (not shown).

Figure 1C:
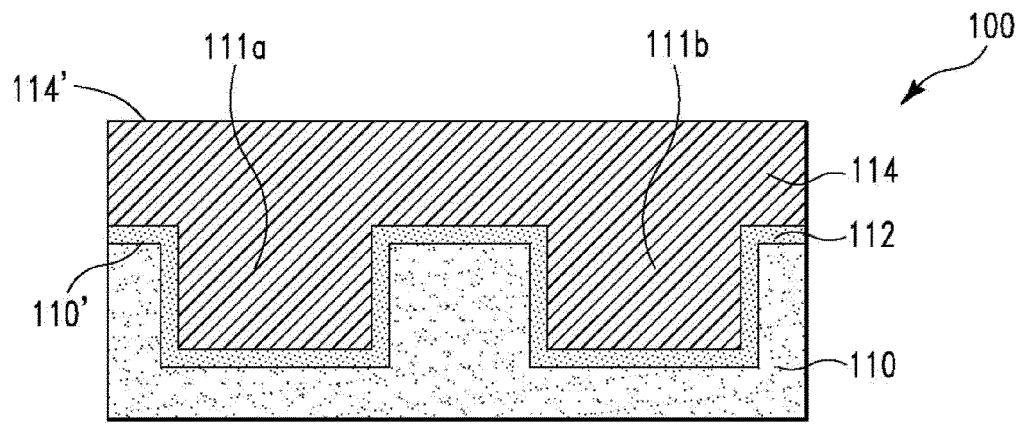
Figure 1C:
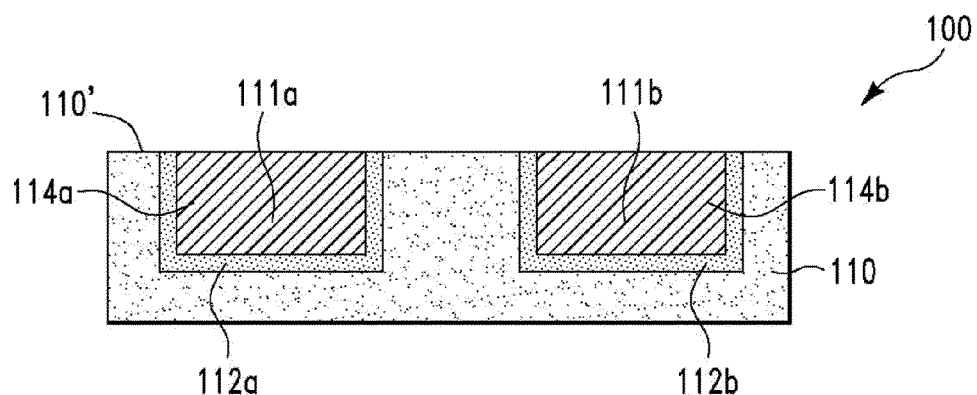

Next, with reference to FIG. 1C, in one embodiment, a diffusion barrier layer 112 is formed on top of the dielectric layer 110 (including on the bottom walls and the side walls of the trenches 111a and 111b). The diffusion barrier layer 112 comprises a diffusion barrier material such as Ta, Ti, Ru, RuTa, TaN, TiN, RuN, RuTaN, a noble metal, or a nitride material of the noble metal. The diffusion barrier layer 112 can be formed by CVD (Chemical Vapor Deposition), PVD (Physical Vapor Deposition), or ALD (Atomic Layer Deposition).

Next, in one embodiment, an electrically conductive layer 114 is formed on top of the diffusion barrier layer 112 resulting in the trenches 111a and 111b being filled. The electrically conductive layer 114 comprises an electrically conductive material such as Cu or Al. The electrically conductive layer 114 can be formed by an electroplating process.

Next, in one embodiment, portions of the electrically conductive layer 114 outside the trenches 111a and 111b are removed. More specifically, these portions of the electrically conductive layer 114 can be removed by a CMP (Chemical Mechanical Polishing) process performed on the top surface 114' of the electrically conductive layer 114 until the top surface 110' the dielectric layer 110 is exposed to the surrounding ambient resulting in the semiconductor structure 100 of FIG. 1C'. The portions of the diffusion barrier layer 112 in the trenches 111a and 111b can be referred to as diffusion barrier regions 112a and 112b, respectively, as shown in FIG. 1C'. Similarly, the portions of the electrically conductive layer 114 in the trenches 111a and 111b can be referred to as a M1 metal line 114a and a first electrode 114b of the efuse structure, respectively, as shown in FIG. 1C'.

Figure 1D:
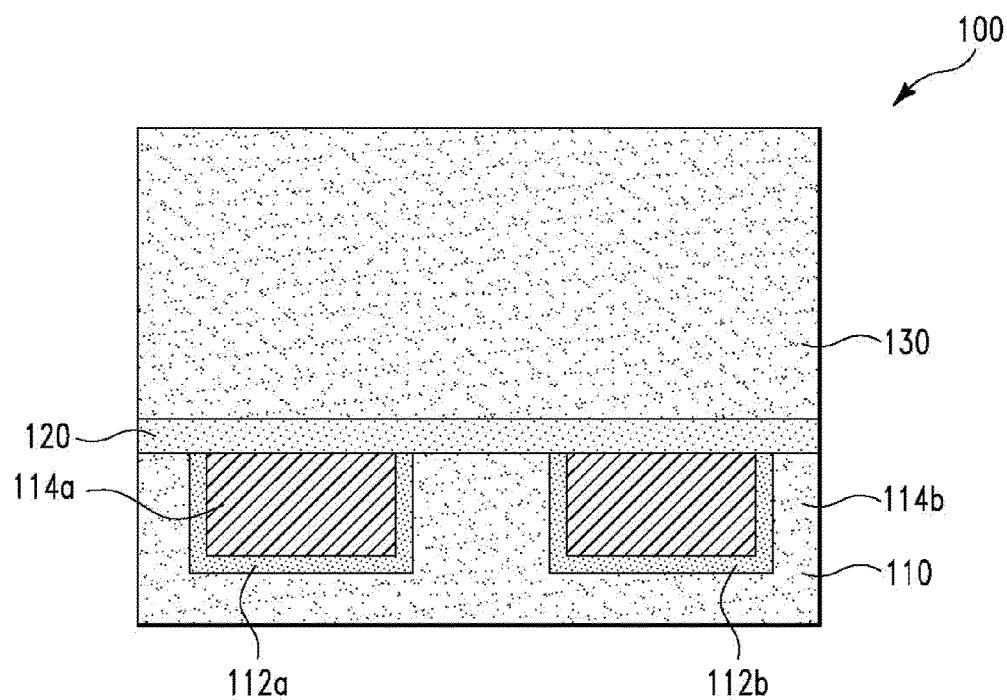

Next, with reference to FIG. 1D, in one embodiment, an electrically insulating cap layer 120 is formed on top of the semiconductor structure 100 of FIG. 1C'. The electrically insulating cap layer 120 can be formed by CVD of a dielectric material such as $Si_3N_4$, SiC, SiC(N,H) or $SiO_2$ on top of the semiconductor structure 100 of FIG. 1C'.

Next, in one embodiment, a dielectric layer 130 is formed on top of the electrically insulating cap layer 120. The dielectric layer 130 comprises a dielectric material such as SiCOH or SiLK. The thickness of the dielectric layer 130 is in the range from 500 angstroms to 10,000 angstroms. The dielectric layer 130 can be formed by CVD or spin-on process.

Figure 1E:
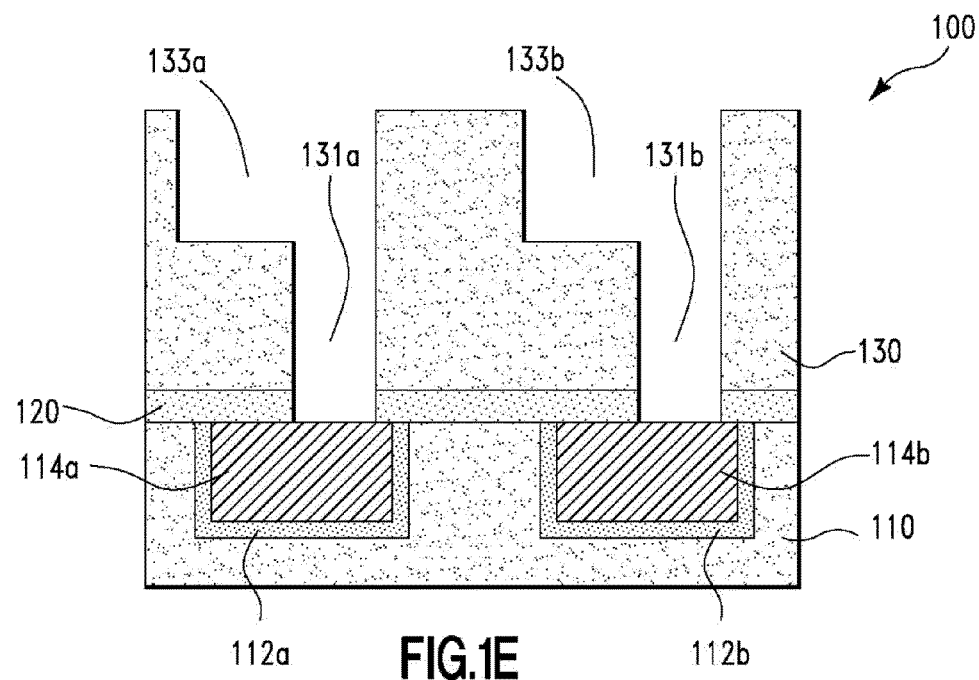

Next, with reference to FIG. 1E, in one embodiment, via holes 131a and 131b and trenches 133a and 133b are formed in the dielectric layer 130 and the electrically insulating cap layer 120. More specifically, the via holes 131a and 131b and trenches 133a and 133b can be formed by a conventional dual damascene process. The via hole 131a and the trench 133a are later used for forming a via and a M2 metal line (not shown), respectively, whereas the via hole 131b and the trench 133b are later used for forming an efuse (not shown) of the efuse structure.

Figure 1F:
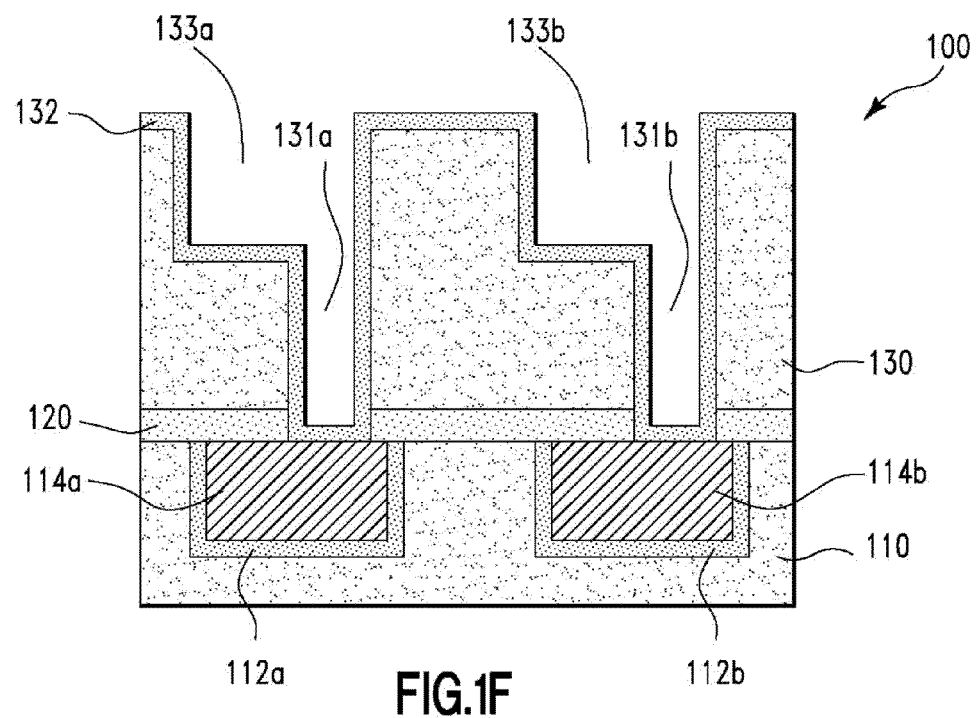

Next, with reference to FIG. 1F, in one embodiment, a diffusion barrier layer 132 is formed on exposed surfaces of the semiconductor structure 100 of FIG. 1E. The diffusion barrier layer 132 can be formed by CVD, PVD, or ALD of a diffusion barrier material such as Ta, Ti, Ru, RuTa, TaN, TiN, RuN, or RuTaN on exposed surfaces of the semiconductor structure 100 of FIG. 1E.

Figure 1G:
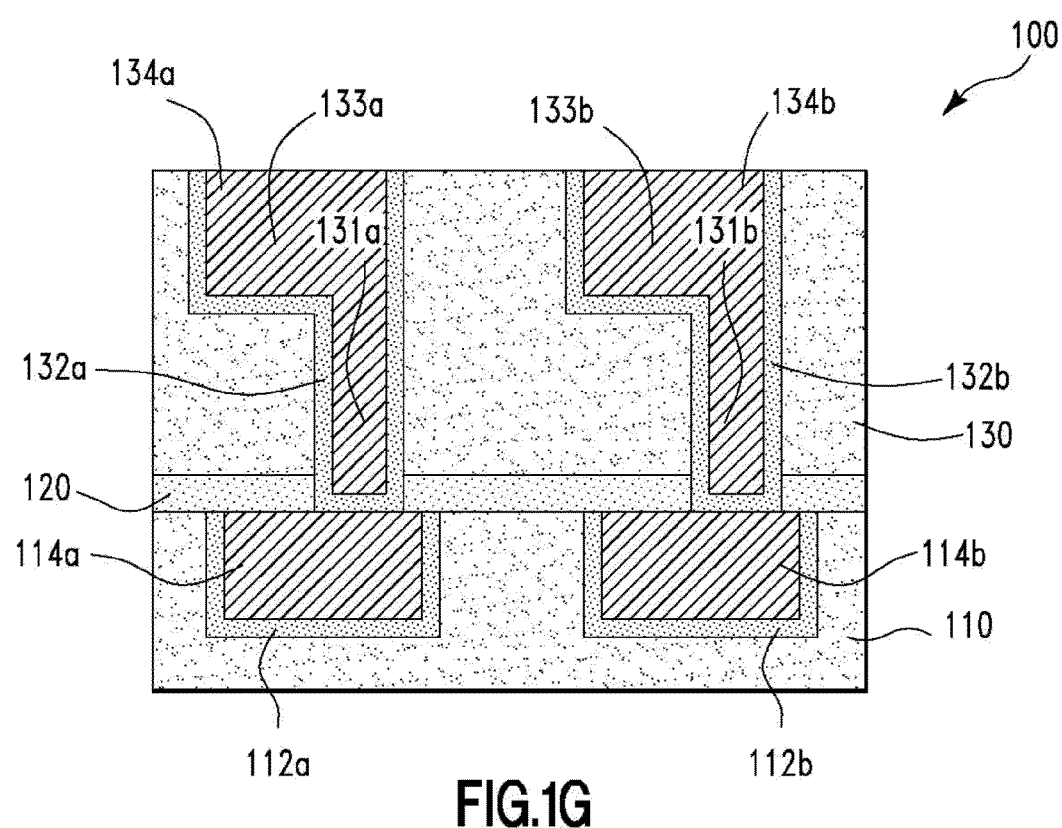

Next, with reference to FIG. 1G, in one embodiment, electrically conductive regions 134a and 134b are formed in the via holes 131a and 131b and the trenches 133a and 133b. More specifically, the electrically conductive regions 134a and 134b can be formed by (i) depositing an electrically conductive material such as Cu or Al on top of the semiconductor structure 100 of FIG. 1F including inside the via holes 131a and 131b and the trenches 133a and 133b and then (ii) removing the excessive electrically conductive material and portions of the diffusion barrier layer 132 outside the via holes 131a and 131b and the trenches 133a and 133b resulting in the semiconductor structure 100 of FIG. 1G. The step (i) can be an electroplating process, whereas the step (ii) can be a CMP process.

With reference to FIG. 1G, it should be noted that the diffusion barrier regions 132a and 132b are what remain of the diffusion barrier layer 132 (FIG. 1F). The diffusion barrier regions 132b will serve as an efuse 132b (also called the fuse element 132b) of the subsequently formed efuse structure.

Figure 1H:
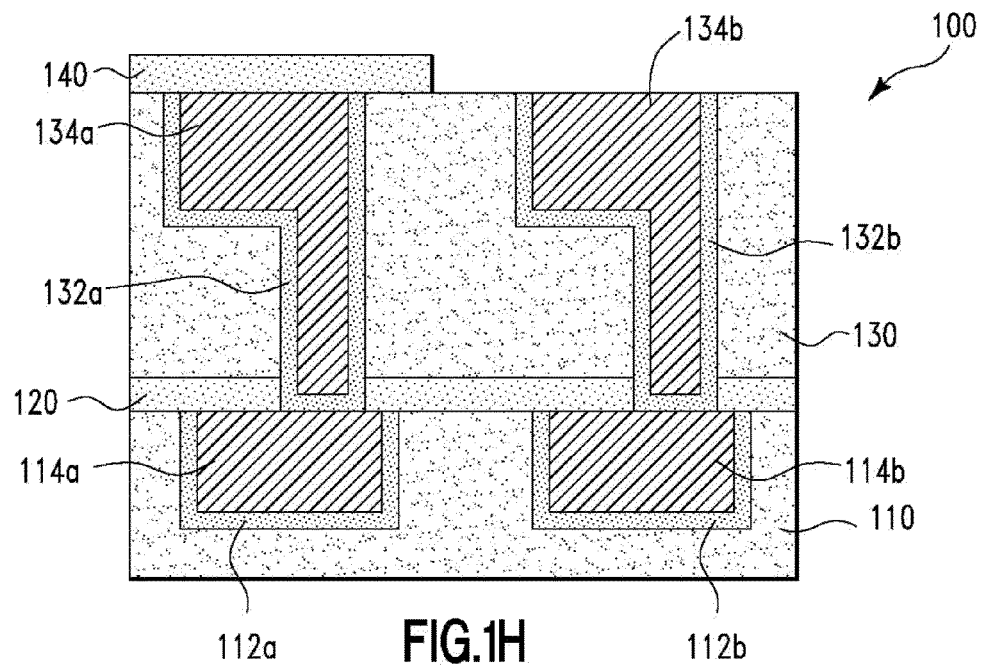

Next, with reference to FIG. 1H, in one embodiment, an electrically insulating cap region 140 is formed on top of the electrically conductive region 134a and the diffusion barrier region 132a of the semiconductor structure 100 of FIG. 1G such that the electrically conductive region 134b remains exposed to the surrounding ambient. The electrically insulating cap region 140 can be formed by CVD of a dielectric material such as $Si_3N_4$, SiC, SiC(N,H) or $SiO_2$ on top of the semiconductor structure 100 of FIG. 1G followed by lithographic and etching processes.

Figure 1I:
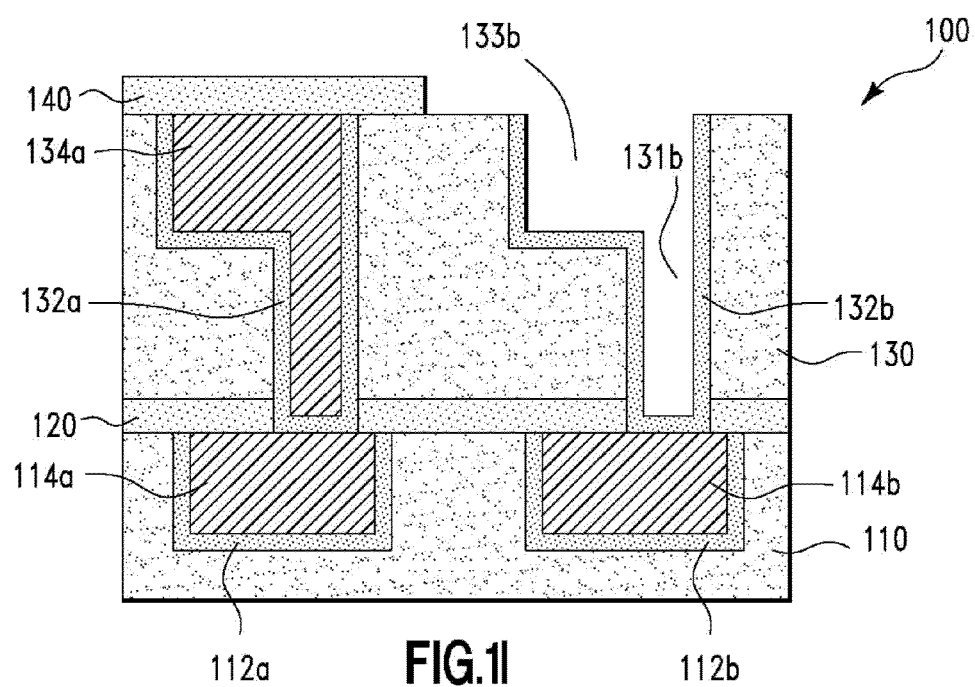

Next, in one embodiment, the electrically conductive region 134b is removed resulting in the semiconductor structure 100 of FIG. 1I. More specifically, the electrically conductive region 134b can be removed by using wet etching.

Figure 1J:
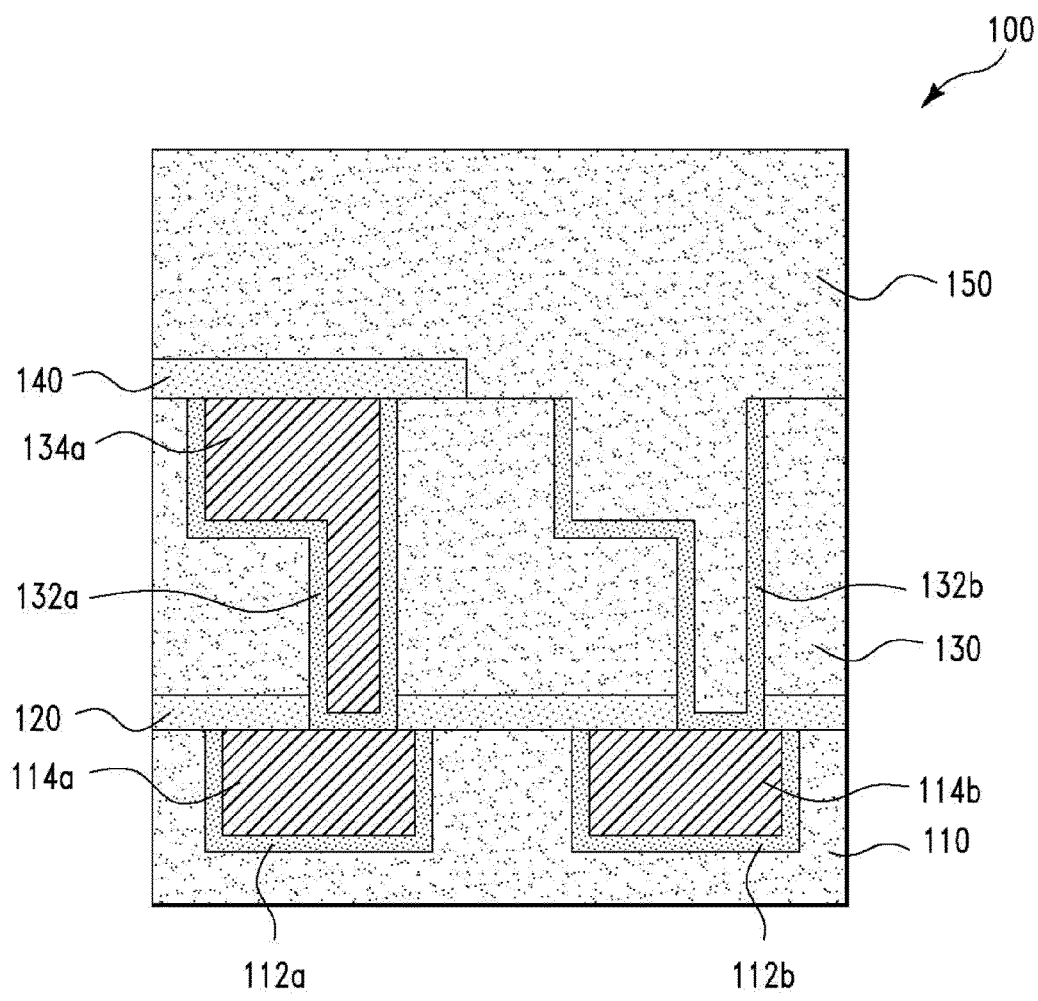

Next, with reference to FIG. 1J, in one embodiment, a dielectric layer 150 is formed on top of the semiconductor structure 100 of FIG. 1I. The dielectric layer 150 comprises a dielectric material such as SiCOH or SiLK. The dielectric layer 150 can be formed by (i) spin-on or (ii) CVD followed by a CMP process.

Figure 1K:
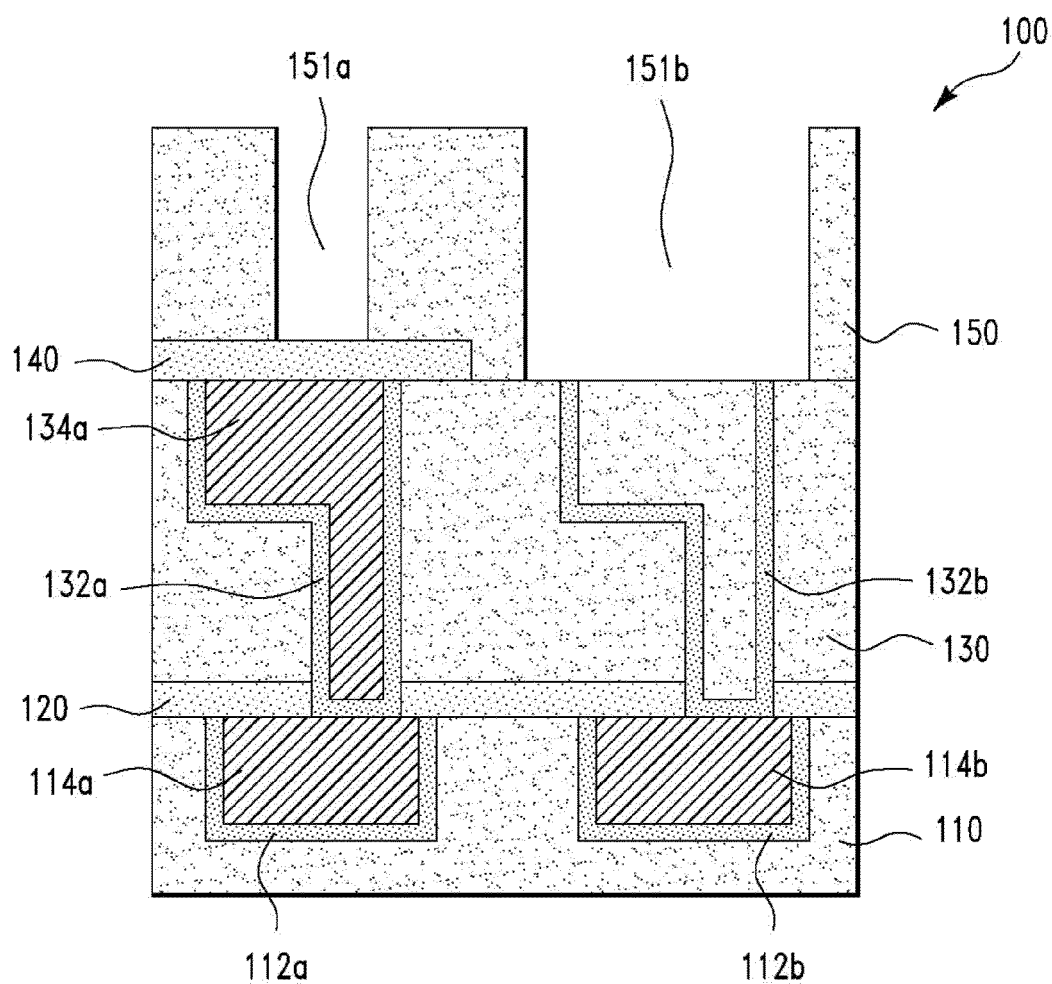
Figure 1L:
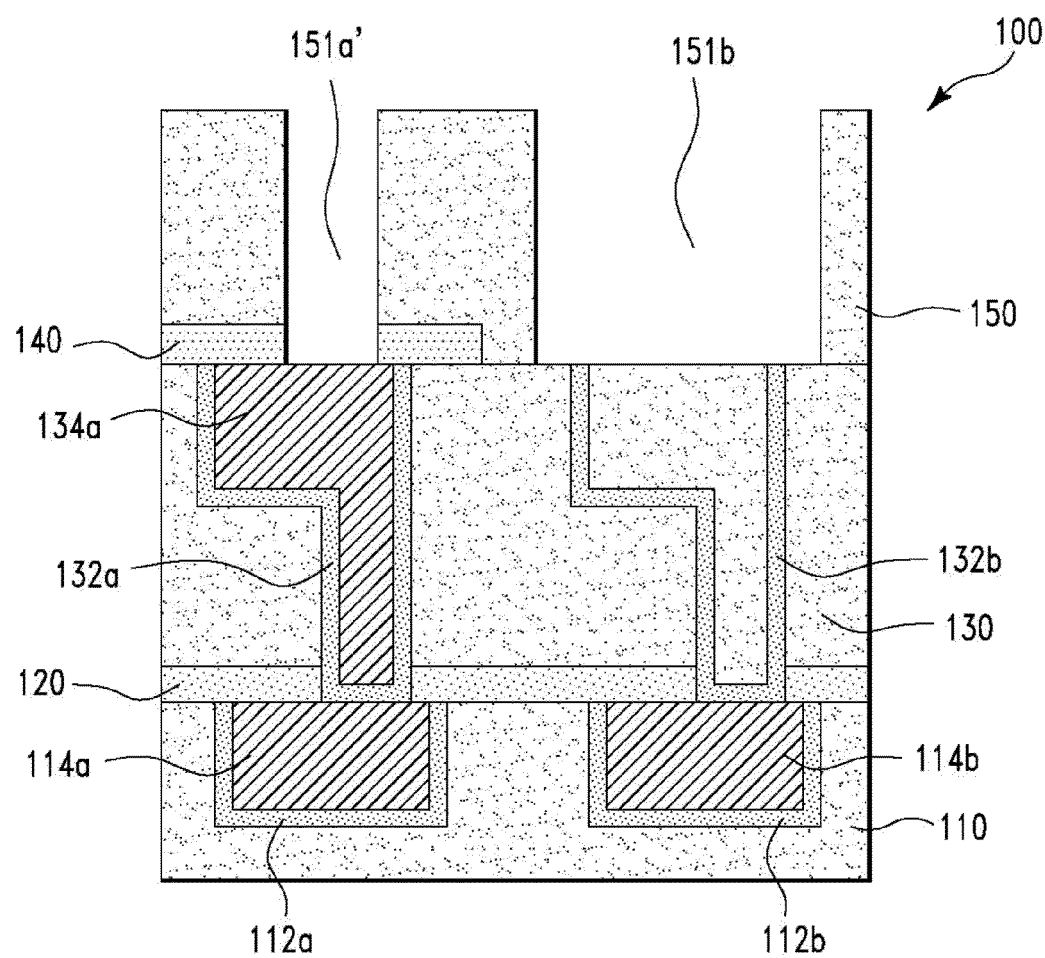

Next, with reference to FIG. 1K, in one embodiment, via holes 151a and 151b are formed in the dielectric layer 150. The via holes 151a and 151b can be formed by lithographic and etching processes. Next, the via hole 151a is extended down through the electrically insulating cap region 140 by using RIE (Reactive Ion Etching) resulting in a via hole 151a' of FIG. 1L.

Figure 1M:
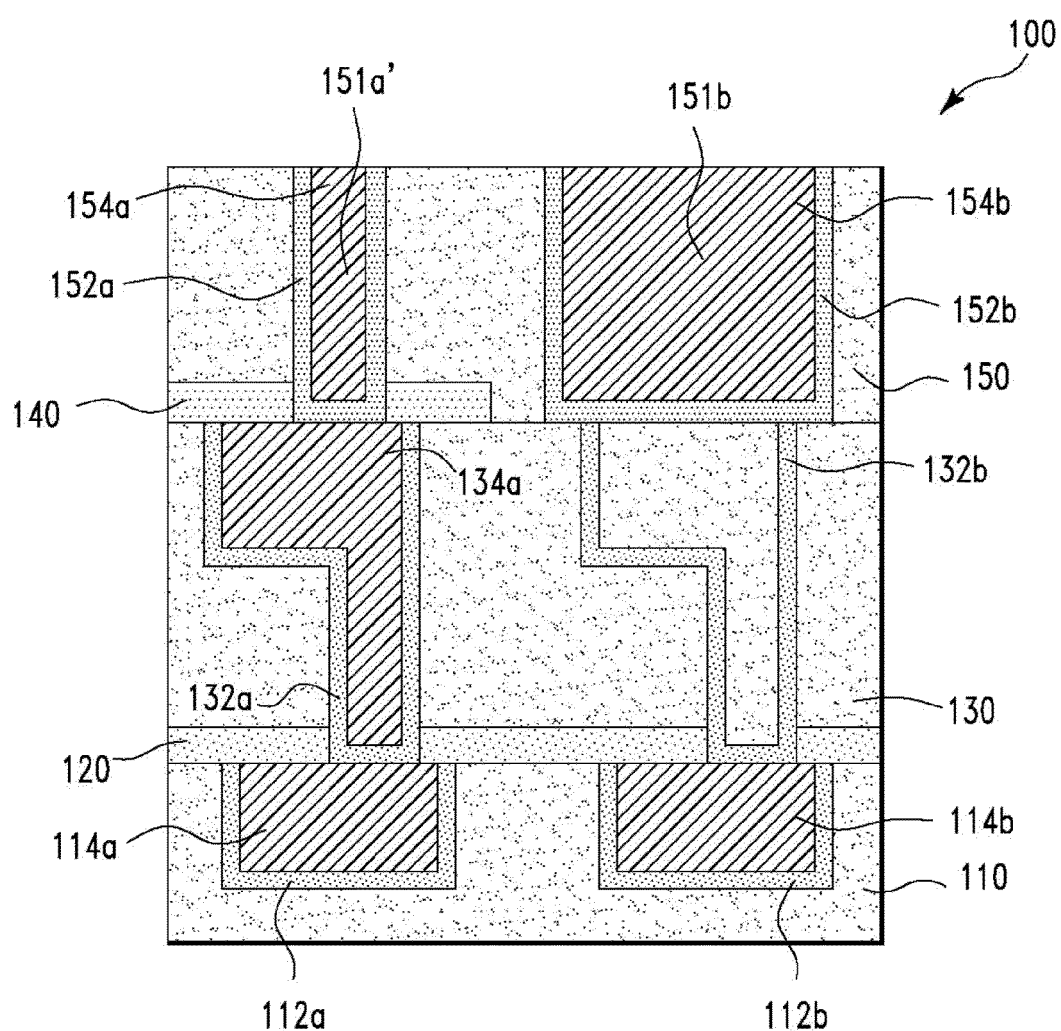

Next, with reference to FIG. 1M, in one embodiment, diffusion barrier regions 152a and 152b are formed on the side walls and bottom walls of the via holes 151a' and 151b. The diffusion barrier regions 152a and 152b comprise a diffusion barrier material such as Ta, Ti, Ru, RuTa, TaN, TiN, RuN, RuTaN, a noble metal, or a nitride material of the noble metal. The formation of the diffusion barrier regions 152a and 152b is similar to the formation of the diffusion barrier region 112a and 112b.

Next, in one embodiment, electrically conductive regions 154a and 154b are formed in the via holes 151a' and 151b, respectively. The electrically conductive regions 154a and 154b comprise an electrically conductive material such as Cu or Al. The formation of the electrically conductive regions 154a and 154b is similar to the formation of the electrically conductive regions 114a and 114b described earlier. The electrically conductive region 154b will serve as a second electrode 154b of the efuse structure. It should be noted that the first electrode 114b, the efuse 132b, and the second electrode 154b constitute an efuse structure 114b+132b+154b.

In one embodiment, the efuse structure 114b+132b+154b can be programmed by blowing off the efuse 132b such that the first electrode 114b and the second electrode 154b are electrically disconnected from each other. More specifically, the efuse 132b can be blown off by sending a sufficiently large current through the efuse 132b.

Figure 2A:
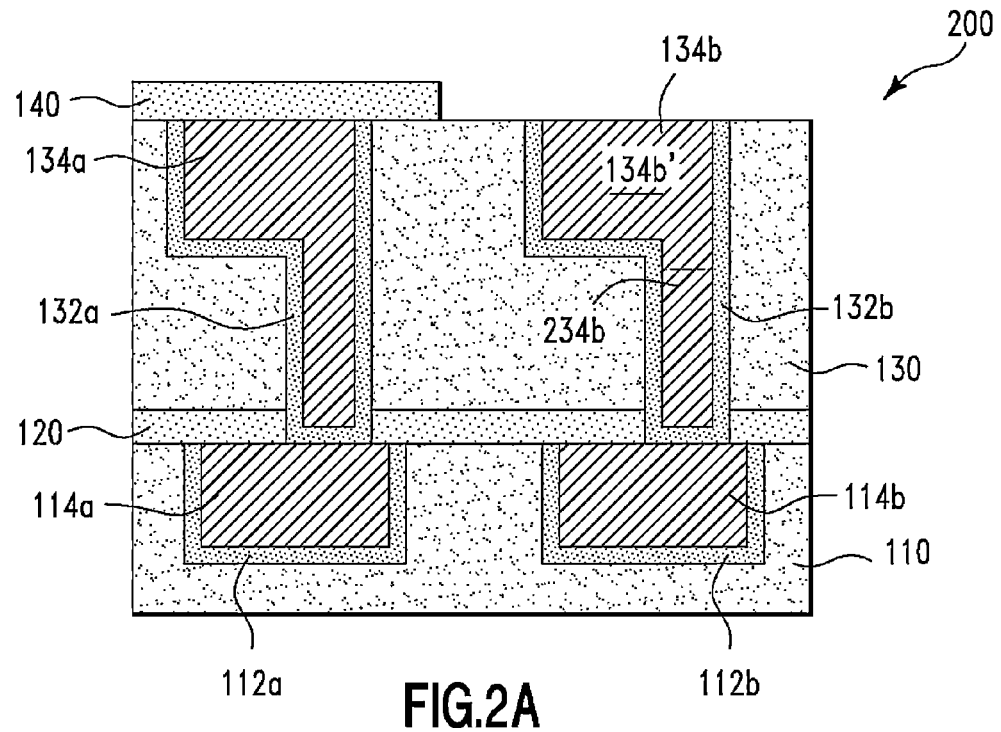
FIGS. 2A-2C show cross-section views used to illustrate a fabrication process for forming another semiconductor structure, in accordance with embodiments of the present invention.
Figure 2A:
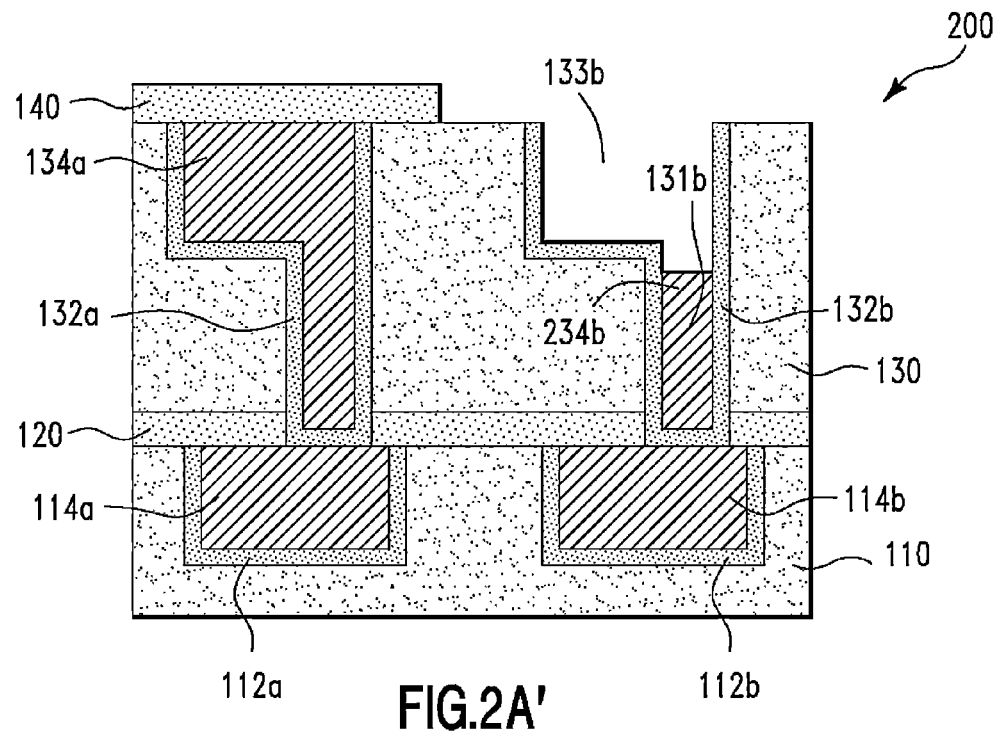
Figure 2B:
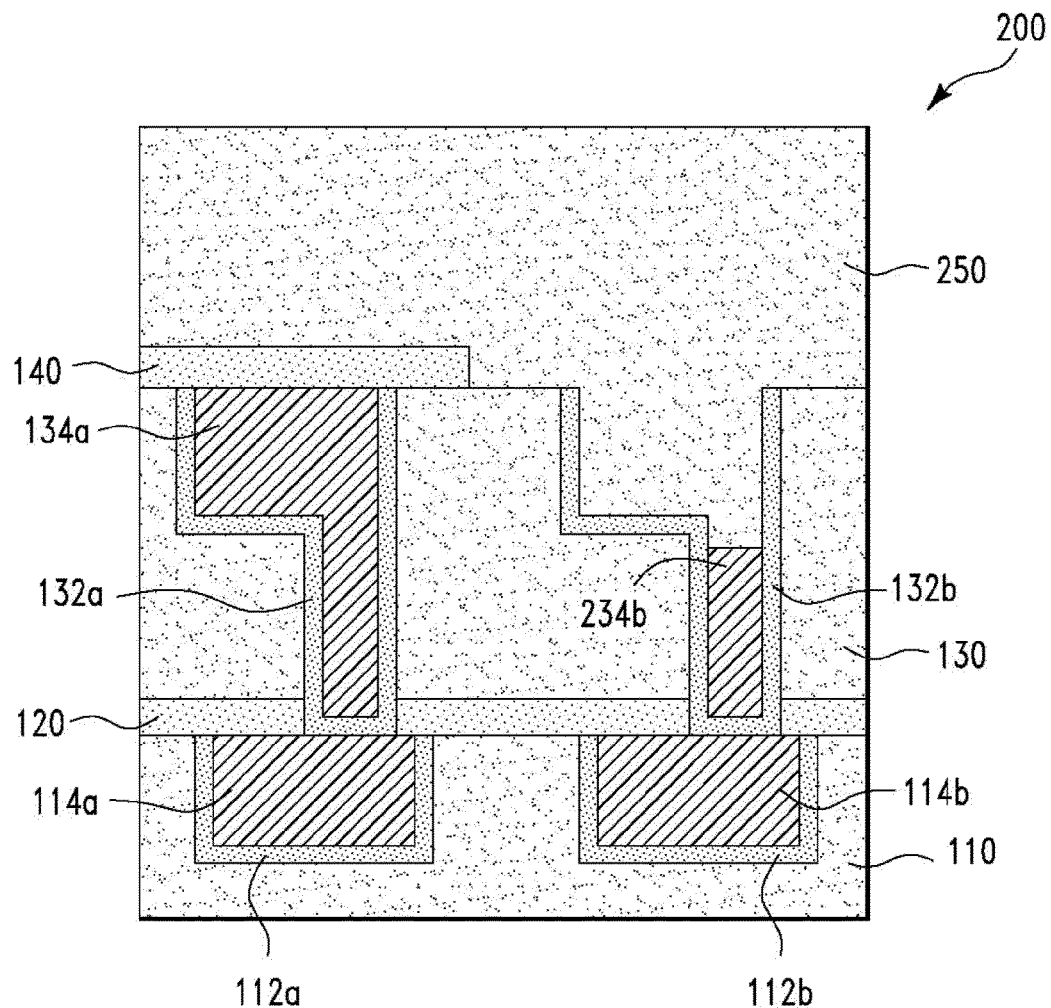
Figure 2C:
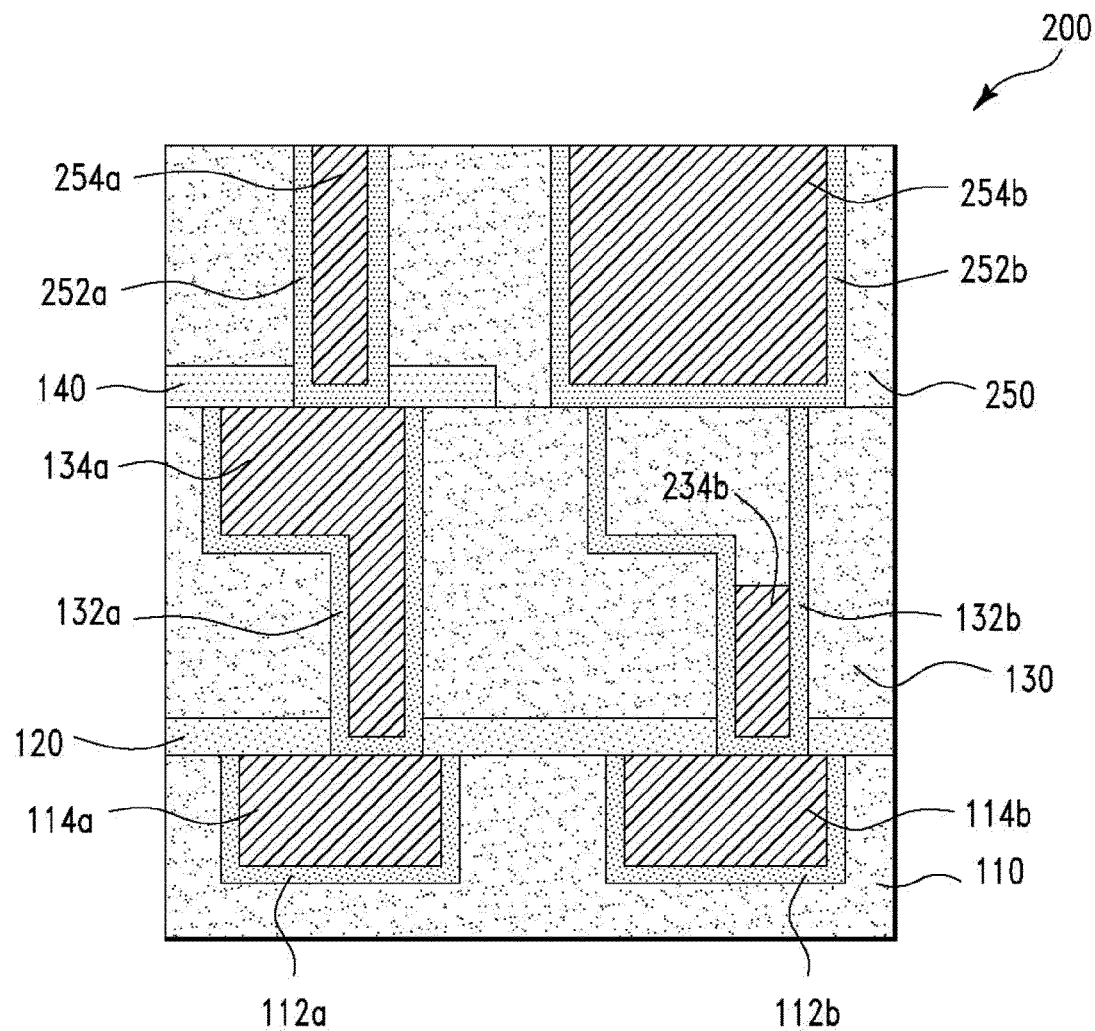

FIGS. 2A-2C show cross-section views used to illustrate a fabrication process for forming a semiconductor structure 200, in accordance with embodiments of the present invention. More specifically, the fabrication process for forming the semiconductor structure 200 starts with the semiconductor structure 200 of FIG. 2A, wherein the semiconductor structure 200 of FIG. 2A is similar to the semiconductor structure 100 of FIG. 1H. The formation of the semiconductor structure 200 of FIG. 2A is similar to the formation of the semiconductor structure 100 of FIG. 1H.

Next, in one embodiment, a top portion 134b' of the electrically conductive region 134b is removed resulting in an electrically conductive region 234b being left in the via hole 131b as shown in FIG. 2A'. The electrically conductive region 134b can be removed by wet etching. In one embodiment, the removal of the top portion 134b' is controlled such that a resistance of the resulting combination of the diffusion barrier regions 132b and the electrically conductive region 234b is equal to a pre-specified value.

Next, with reference to FIG. 2B, in one embodiment, a dielectric layer 250 is formed on top of the semiconductor structure 200 of FIG. 2A'. The dielectric layer 250 comprises a dielectric material such as SiCOH or SiLK. The dielectric layer 250 can be formed by (i) spin-on or (ii) CVD followed by a CMP process.

Next, with reference to FIG. 2C, in one embodiment, diffusion barrier regions 252a and 252b and electrically conductive regions 254a and 254b are formed in the dielectric layer 250 in a manner which is similar to the manner in which the diffusion barrier regions 152a and 152b and the electrically conductive regions 154a and 154b are formed in FIG. 1M. The electrically conductive region 254b will serve as a second electrode 254b of an efuse structure of the semiconductor structure 200 of FIG. 2C. It should be noted that the first electrode 114b, the efuse 132b, the electrically conductive region 234b, and the second electrode 254b are parts of an efuse structure 114b+132b+234b+254b.

In one embodiment, the efuse structure 114b+132b+234b+254b can be programmed in a manner which is similar to the manner in which the efuse structure 114b+132b+154b of semiconductor structure 100 of FIG. 1M is programmed. It should be noted that the efuse structure 114b+132b+234b+254b can be used as a resistor.

Figure 3A:
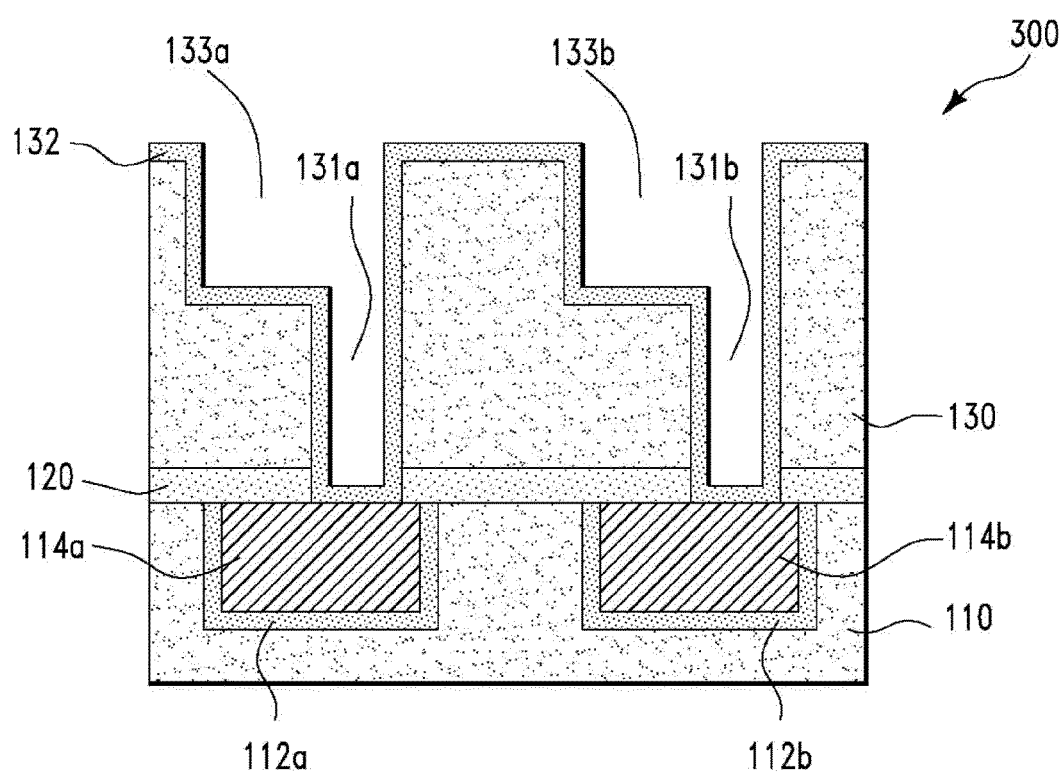
FIGS. 3A-3H show cross-section views used to illustrate a fabrication process for forming an alternative semiconductor structure, in accordance with embodiments of the present invention.
Figure 3A:
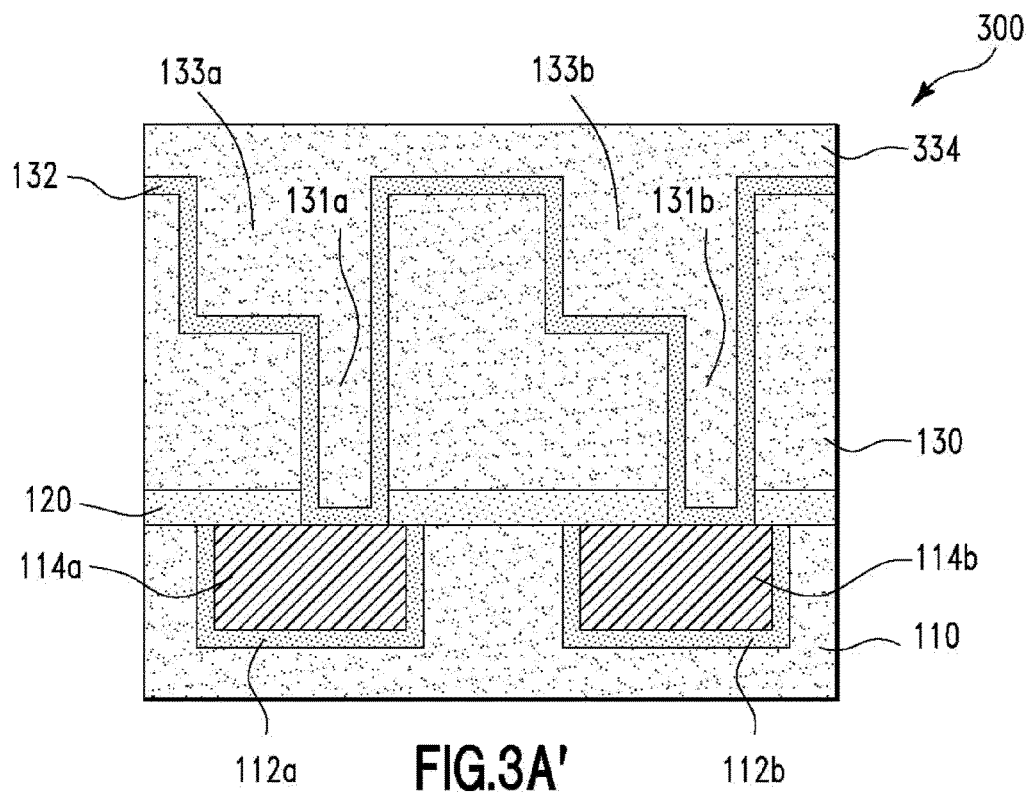

FIGS. 3A-3H show cross-section views used to illustrate a fabrication process for forming a semiconductor structure 300, in accordance with embodiments of the present invention. More specifically, the fabrication process for forming the semiconductor structure 300 starts with the semiconductor structure 300 of FIG. 3A, wherein the semiconductor structure 300 of FIG. 3A is similar to the semiconductor structure 100 of FIG. 1F. The formation of the semiconductor structure 300 of FIG. 3A is similar to the formation of the semiconductor structure 300 of FIG. 1F.

Next, with reference to FIG. 3A', in one embodiment, a dielectric layer 334 is formed on top of the diffusion barrier layer 132 resulting in the via holes 131a and 131b and the trenches 133a and 133b being filled. The dielectric layer 334 comprises a dielectric material such as SiLK or SiCOH. The dielectric layer 334 can be formed by CVD or spin-on process.

Figure 3B:
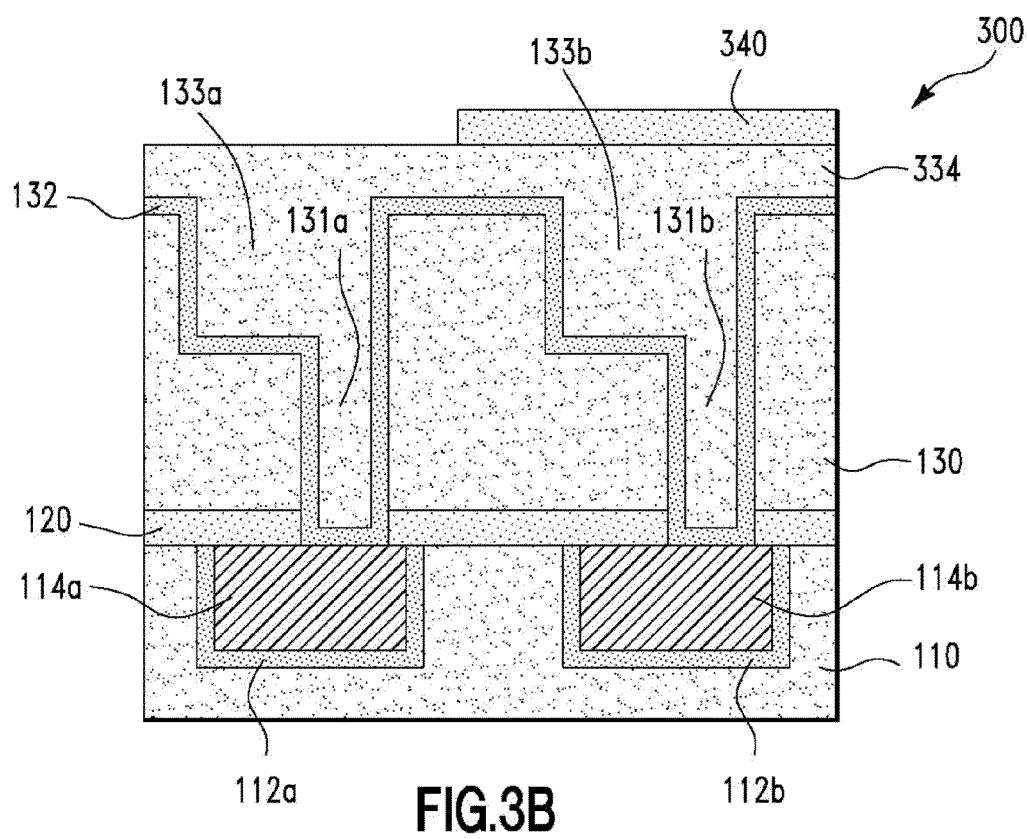

Next, with reference to FIG. 3B, in one embodiment, an electrically insulating cap region 340 is formed on top of the dielectric layer 334 such that (i) the electrically insulating cap region 340 does not overlap the via hole 131a and the trench 133a and (ii) the via hole 131b and the trench 133b are directly beneath the electrically insulating cap region 340. The electrically insulating cap region 340 can be formed by CVD or spin-on process of a dielectric material such as $Si_3N_4$, SiC, SiC(N,H) or $SiO_2$ on top of the semiconductor structure 300 of FIG. 3A' followed by lithographic and etching processes.

Figure 3C:
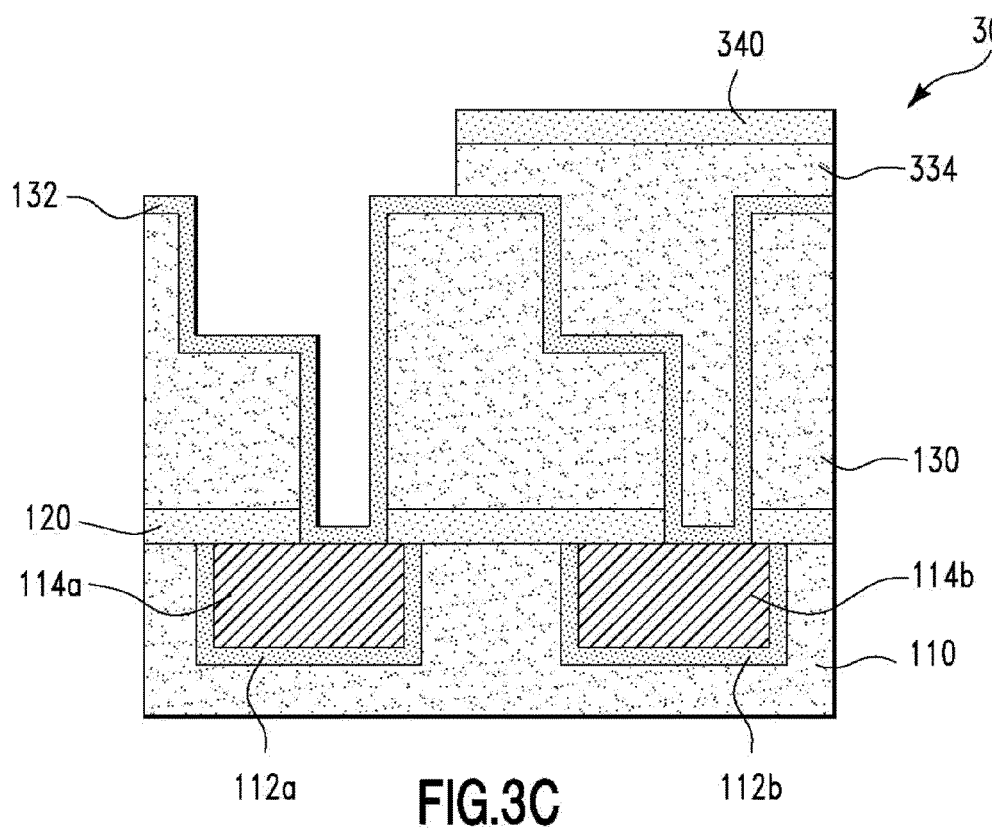

Next, in one embodiment, the electrically insulating cap region 340 is used as a blocking mask to etch down the dielectric layer 334 until portions of the dielectric layer 334 inside the via hole 131a and the trench 133a are completely removed resulting in the semiconductor structure 300 of FIG. 3C. The step of etching down the dielectric layer 334 can be performed by using RIE.

Figure 3D:
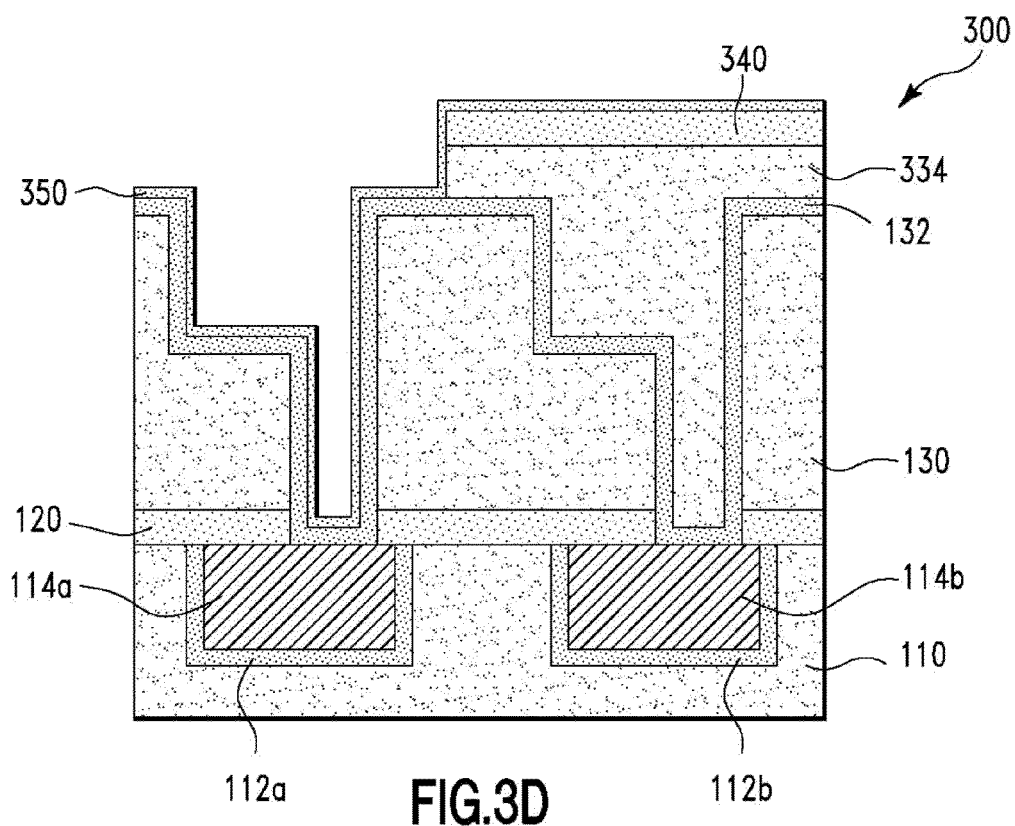

Next, with reference to FIG. 3D, in one embodiment, a diffusion barrier layer 350 is formed on exposed surfaces of the semiconductor structure 300 of FIG. 3C. The diffusion barrier layer 350 can be formed by CVD, PVD, or ALD of a diffusion barrier material such as TaN or TiN on exposed surfaces of the semiconductor structure 300 of FIG. 3C.

Figure 3E:
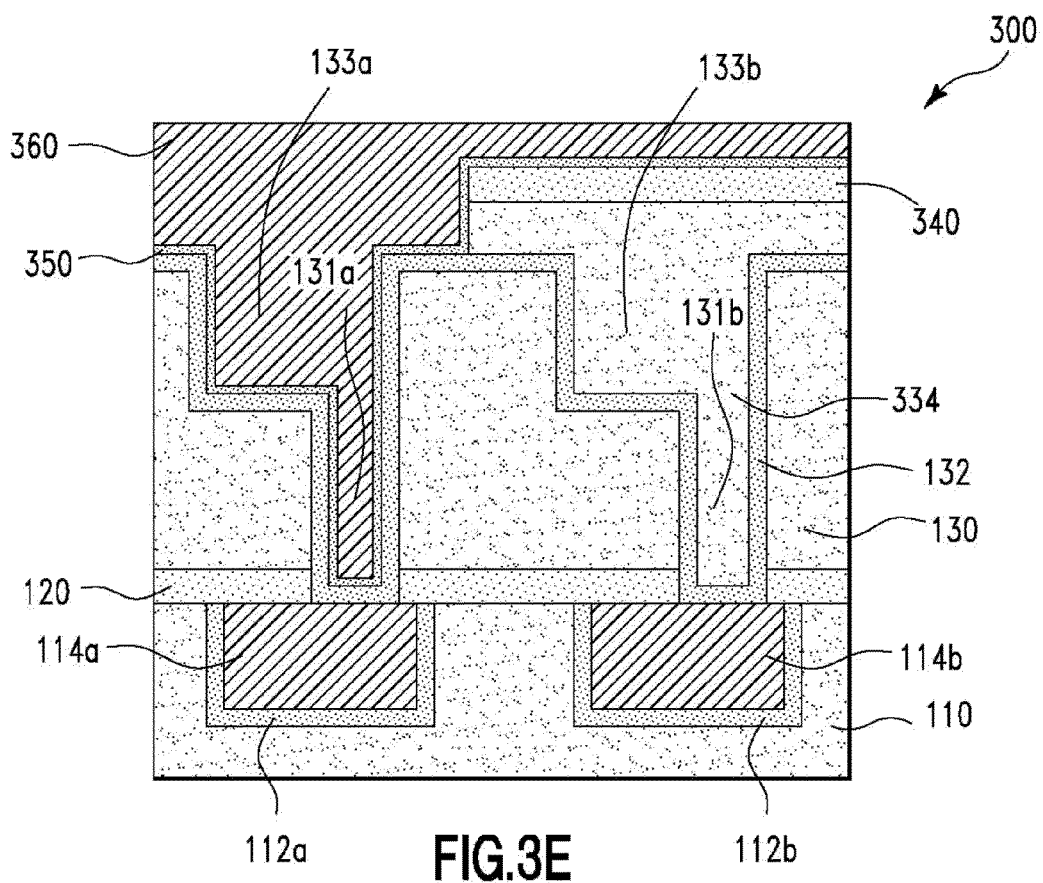

Next, with reference to FIG. 3E, in one embodiment, an electrically conductive layer 360 is formed on top of the semiconductor structure 300 of FIG. 3D resulting in the via hole 131a and the trench 133a are filled. The electrically conductive layer 360 comprises an electrically conductive material such as Cu or Al. The electrically conductive layer 360 can be formed by an electroplating process.

Figure 3F:
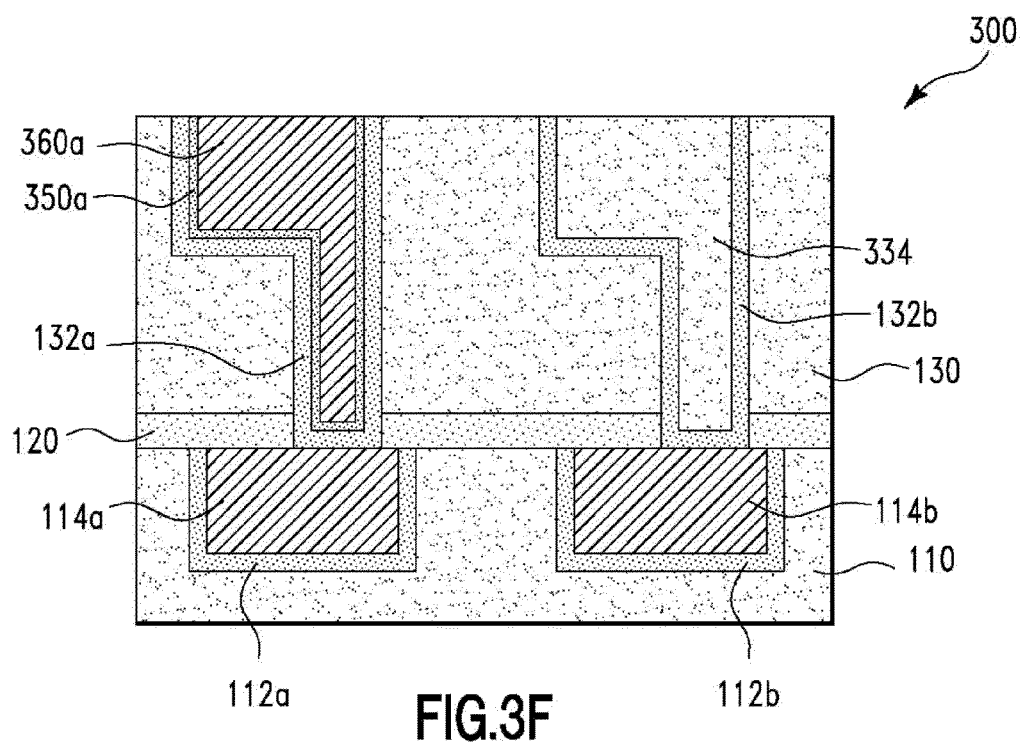

Next, in one embodiment, (i) portions of the electrically conductive layer 360 and the diffusion barrier layer 350 outside the via hole 131a and trench 133a, (ii) portions of the dielectric layer 334 outside the via hole 131b and the trench 133b, and (iii) the electrically insulating cap region 340 are removed resulting in the semiconductor structure 300 of FIG. 3F. These removals can be performed by a CMP process.

Figure 3G:
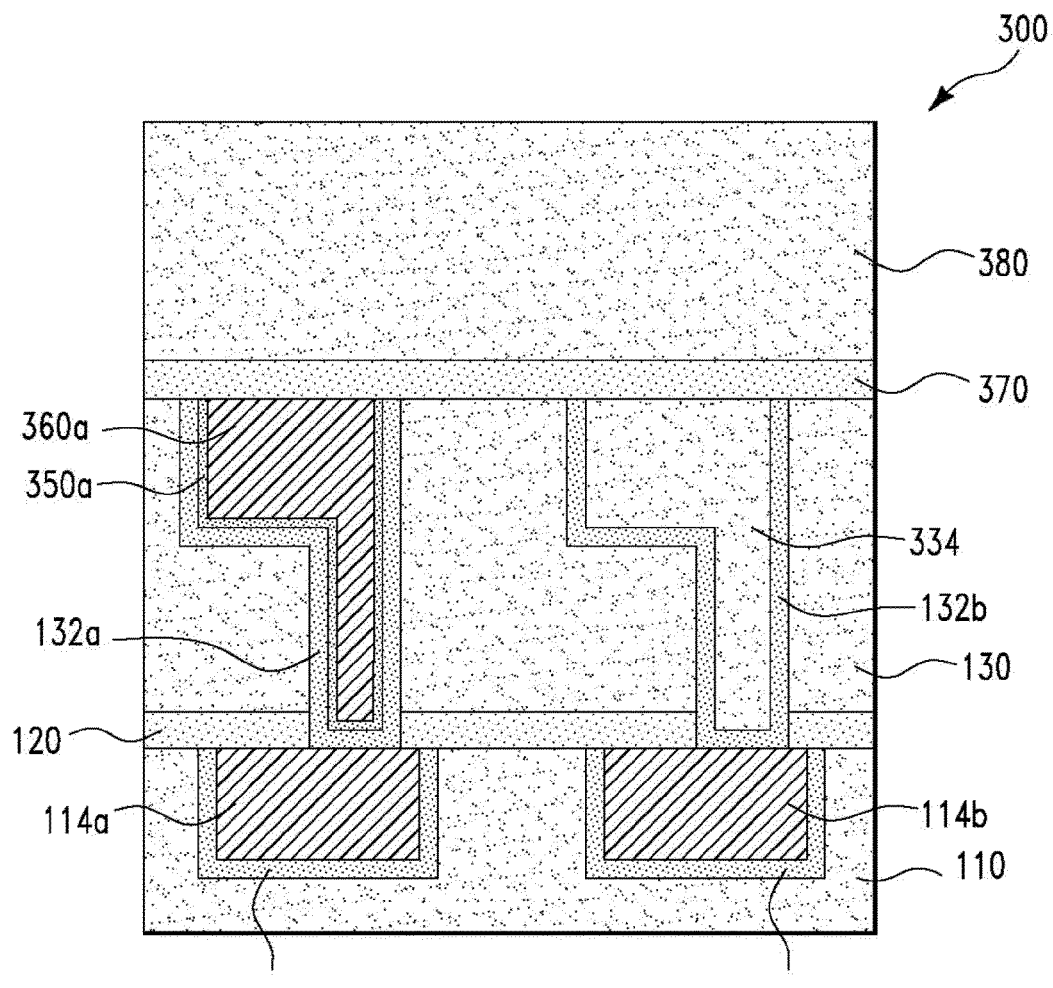

Next, with reference to FIG. 3G, in one embodiment, an electrically insulating cap layer 370 is formed on top of the semiconductor structure 300 of FIG. 3F. The electrically insulating cap layer 370 comprises a dielectric material such as $Si_3N_4$, SiC, SiC(N,H) or $SiO_2$. The electrically insulating cap layer 370 can be formed by CVD or spin-on process.

Next, in one embodiment, a dielectric layer 380 is formed on top of the electrically insulating cap layer 370. The dielectric layer 380 comprises a dielectric material such as SiCOH or SiLK. The dielectric layer 380 can be formed by CVD or spin-on process.

Figure 3H:
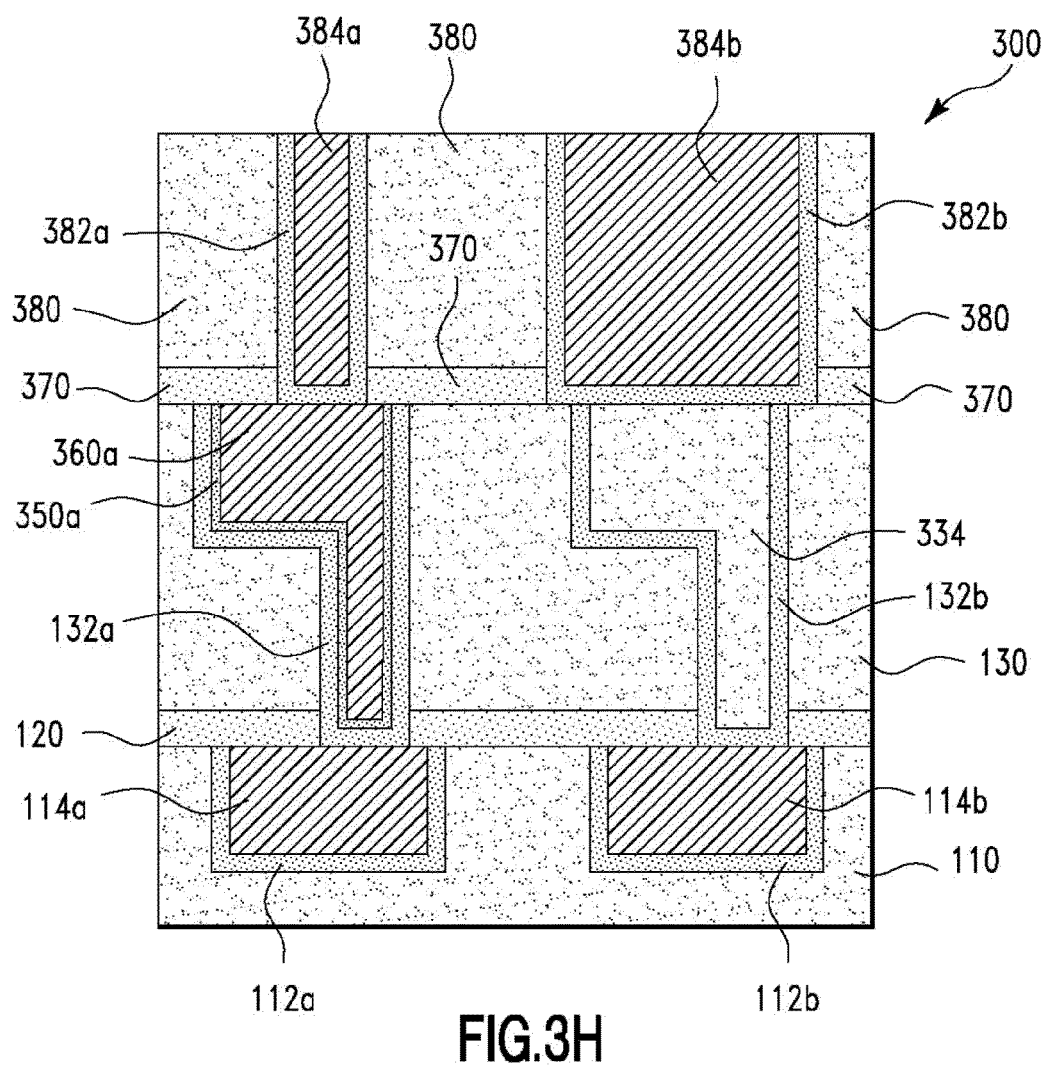

Next, with reference to FIG. 3H, in one embodiment, diffusion barrier regions 382a and 382b and the electrically conductive regions 384a and 384b are formed in the dielectric layer 380 in a manner which is similar to the manner in which the diffusion barrier regions 152a and 152b and electrically conductive regions 154a and 154b are formed in FIG. 1M. The electrically conductive region 384b will serve as a second electrode 384b of an efuse structure of the semiconductor structure 300 of FIG. 3H. It should be noted that the first electrode 114b, the efuse 132b, and the second electrode 384b constitute an efuse structure 114b+132b+384b.

In one embodiment, the structure of the semiconductor structure 300 of FIG. 3H is similar to the structure of the semiconductor structure 100 of FIG. 1M except that the semiconductor structure 300 comprises the diffusion barrier region 350a. The diffusion barrier regions 132a and 350a can be collectively referred to as a diffusion barrier region 132a+350a. The thickness of the diffusion barrier region 132a+350a can be customized to a desired thickness by adjusting the thickness of the diffusion barrier region 350a. As a result, in comparison with the diffusion barrier region 132b of FIG. 1M, the diffusion barrier region 132a+350a of FIG. 3H improves the prevention of diffusion of the electrically conductive material of the electrically conductive region 360a through the diffusion barrier region 132a+350a. In one embodiment, the efuse structure 114b+132b+384b can be programmed in a manner which is similar to the manner in which the efuse structure 114b+132b+154b of semiconductor structure 100 of FIG. 1M is programmed.

In summary, with reference to FIG. 1M, the diffusion barrier regions 132a and 132b (i) are similar and (ii) can be formed simultaneously, wherein the diffusion barrier region 132b can be used as an efuse of the efuse structure 114b+132b+154b. In FIG. 2C, the electrically conductive region 234b is left in the via hole 131b so as to decrease the resistance of the efuse. As a result, the resistance of the efuse can be tuned to a desired value. Therefore, the efuse structure 114b+132b+234b+254b can also be used as a resistor having a desired resistance. In FIG. 3H, the electrically conductive region 360a is surrounded by the diffusion barrier region 132a+350a whose thickness can be at any desirable value.

In the embodiments described above, the dielectric layer 110 is the first inter-level dielectric layer. In an alternative embodiment, the dielectric layer 110 can be second, third, or any inter-level dielectric layer of the back-end-of-line layer.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A structure, comprising:
    a substrate;
    a first electrode in the substrate, wherein a first direction is oriented perpendicular to a top surface of the first electrode, and wherein the first electrode comprises a first electrically conductive material;
    a first dielectric layer above both the substrate and the first electrode in the first direction, wherein a top surface of the first dielectric layer is further from the top surface of the first electrode than is any other surface of the first dielectric layer, and wherein the first dielectric layer comprises a first dielectric material and a second dielectric material;
    a second dielectric layer above the first dielectric layer in the first direction, wherein a bottom surface of the second dielectric layer is in direct physical contact with the top surface of the first dielectric layer, wherein the second dielectric layer comprises the second dielectric material different from the first dielectric material; and
    a fuse element buried in the first dielectric layer, wherein the second dielectric material differs from the first dielectric material, and wherein the fuse element is in direct physical contact with both the first dielectric material and the second dielectric material.

2. The structure of claim 1, wherein a bottom surface of the fuse element is in direct physical contact with the top surface of the first electrode.

3. The structure of claim 2, further comprising:
    a second electrode in the second dielectric layer and above the fuse element in the first direction, wherein the first electrode and the second electrode are electrically coupled to each other through the fuse element, wherein the second electrode comprises a second electrically conductive material, and wherein the first direction is oriented perpendicular to the top surface of the first dielectric layer, the bottom surface of the second dielectric layer, the bottom surface of the fuse element, and the top surface of the fuse element.

4. A structure, comprising:
a substrate;
a first electrode in the substrate, wherein a first direction is oriented perpendicular to a top surface of the first electrode, and wherein the first electrode comprises a first electrically conductive material;
a first dielectric layer above both the substrate and the first electrode in the first direction, wherein a top surface of the first dielectric layer is further from the top surface of the first electrode than is any other surface of the first dielectric layer, and wherein the first dielectric layer comprises a first dielectric material and a second dielectric material;
a second dielectric layer above the first dielectric layer in the first direction, wherein a bottom surface of the second dielectric layer is in direct physical contact with the top surface of the first dielectric layer, and wherein the second dielectric layer comprises the second dielectric material; and
a fuse element buried in the first dielectric layer, wherein a top surface of the fuse element is coplanar with both the top surface of the first dielectric layer and the bottom surface of the second dielectric layer.

5. The structure of claim 4, further comprising:
a second electrode in the second dielectric layer and above the fuse element in the first direction, wherein the first electrode and the second electrode are electrically coupled to each other through the fuse element, wherein the second electrode comprises a second electrically conductive material, and wherein the first direction is oriented perpendicular to the top surface of the first dielectric layer, the bottom surface of the second dielectric layer, the bottom surface of the fuse element, and the top surface of the fuse element.

6. The structure of claim 1, further comprising:
a second electrode in the second dielectric layer and above the fuse element in the first direction, wherein the first electrode and the second electrode are electrically coupled to each other through the fuse element, wherein the second electrode comprises a second electrically conductive material, and wherein the first direction is oriented perpendicular to the top surface of the first dielectric layer, the bottom surface of the second dielectric layer, the bottom surface of the fuse element, and the top surface of the fuse element.

7. The structure of claim 1, wherein the substrate comprises a dielectric material.

8. The structure of claim 1, wherein the fuse element comprises a diffusion barrier material which is electrically conductive and configured to prevent copper from diffusing through the fuse element.

9. The structure of claim 8, wherein the diffusion barrier material comprises a material selected from the group consisting of Ta, Ti, Ru, Ta, TaN, TiN, RuN, RuTaN, a noble metal material, and a nitride material of the noble metal material.

10. A structure, comprising:
a substrate;
a first electrode in the substrate, wherein a first direction is oriented perpendicular to a top surface of the first electrode, and wherein the first electrode comprises a first electrically conductive material;
a first dielectric layer above both the substrate and the first electrode in the first direction, wherein a top surface of the first dielectric layer is further from the top surface of the first electrode than is any other surface of the first dielectric layer, and wherein the first dielectric layer comprises a first dielectric material and a second dielectric material;
a second dielectric layer above the first dielectric layer in the first direction, wherein a bottom surface of the second dielectric layer is in direct physical contact with the top surface of the first dielectric layer, and wherein the second dielectric layer comprises the second dielectric material;
a fuse element buried in the first dielectric layer; and
a first diffusion barrier layer in the second dielectric layer, said second electrically conductive material completely filling a space surrounded by the first diffusion barrier layer, said fuse element consisting of a second diffusion barrier layer, said second dielectric material disposed in a space surrounded by the second diffusion barrier layer, said second diffusion barrier layer separating the second dielectric material in the first dielectric layer from the first dielectric material in the first dielectric layer.

11. The structure of claim 10, wherein the second dielectric material in the first dielectric layer completely fills the space surrounded by the second diffusion barrier layer.

12. The structure of claim 10, wherein the second dielectric material in the first dielectric layer partially fills the space surrounded by the second diffusion barrier layer, wherein an electrically conducting material partially fills the space surrounded by the second diffusion barrier layer, and wherein the electrically conducting material is disposed between the first electrically conductive material and the second dielectric material in the first dielectric layer.

13. The structure of claim 12, wherein the electrically conducting material together with the second dielectric material in the first dielectric layer completely fills the space surrounded by the second diffusion barrier layer, and wherein the second dielectric material in the first dielectric layer is in direct physical contact with both the first diffusion barrier layer and the electrically conducting material.

14. The structure of claim 1, further comprising an electrically insulating cap layer on and in direct physical contact with the top surface of the first electrode, and wherein the electrically insulating cap layer is in direct physical contact with the first dielectric material.

15. The structure of claim 14, wherein the electrically insulating cap layer comprises $Si_3N_4$, SiC, SiC(N,H), or $SiO_2$.

16. The structure of claim 1, wherein the substrate comprises an electrically conducting material that is electrically insulated from the first conductive material by electrically insulative material disposed between the electrically conducting material and the first conductive material.

* * * * *